United States Patent [19]

Paltiel

[11] Patent Number: 5,212,447
[45] Date of Patent: May 18, 1993

[54] APPARATUS AND TECHNIQUE FOR NMR DIFFUSION MEASUREMENT

[75] Inventor: Zvi Paltiel, Ness Ziona, Israel
[73] Assignee: Numar Corporation, Malvern, Pa.
[21] Appl. No.: 624,975
[22] Filed: Dec. 3, 1990
[51] Int. Cl.⁵ ........................................... G01R 33/20
[52] U.S. Cl. ..................................... 324/300; 324/303
[58] Field of Search ............... 324/300, 303, 307, 318, 324/322

[56] References Cited

U.S. PATENT DOCUMENTS

| | | |
|---|---|---|
| 2,779,885 | 1/1957 | Reynst . |
| 3,168,686 | 2/1965 | King . |
| 3,213,357 | 10/1965 | Brown . |
| 3,223,898 | 12/1965 | Bey . |
| 3,258,658 | 6/1966 | Vaughn . |
| 3,258,681 | 6/1966 | Brown . |
| 3,483,465 | 12/1969 | Baker . |
| 3,667,035 | 5/1972 | Slichter . |
| 4,350,955 | 9/1982 | Jackson . |
| 4,424,478 | 1/1984 | Lauffer ................................ 324/303 |
| 4,639,673 | 1/1987 | Zijistra . |
| 4,710,713 | 12/1987 | Strikman ............................ 324/303 |
| 4,717,878 | 1/1988 | Taicher et al. ...................... 324/303 |
| 4,719,423 | 1/1988 | Vinegar et al. ..................... 324/303 |

FOREIGN PATENT DOCUMENTS 2141236 12/1984 United Kingdom .

OTHER PUBLICATIONS

Simpson, J. H. et al., "Diffusion and Nuclear Spin Relaxation in Water", *The Physical Review*, 111, No. 5, Sep. 1, 1958, p. 1201.
Douglas, D. C., et al., "Diffusion in Paraffin Hydrocarbons", *Journal of Physical Chem.*, 62, 1102 (1958).
Woessner, D. E., "NMR Spin Echo Self Diffusion Measurement on Fluids Undergoing Restricted Diffusion", *Journal of P. Chem.*, 87, 1306 (1963).
Wayne, R. C. et al., "Nuclear Magnetic Resonance Study of Self-Diffusion in Bonded Medium", *P. Review*, 151, 1, Apr. 10, 1964.
Stejskql, E. O., et al., "Spin Diffusion Measurements: Spin Echoes in the Presence of a Time Dependent Field Gradient", *J. Chem. Phy.* 288-292, 1965.
Packer, K. J. et al., "Pulsed NMR Studies of Restricted Diffusion", *J. of Colloid and Interfare Science*, vol. 40, No. 2, Aug. 1972.
Neuman, C. H., "Spin Echo of Spin Diffusion in a Bonded Medium", *J. of Chem. Phy.*, vol. 60, No. 11, 1 Jun. 1974.
Williams, W. D. et al., "A Pulsed Gradient Multiple-Spin Echo NMR Tech. for Measuring Diffusion in the Presence of Background Magnetic Field Gradients", *J. of Mag. Res.* 31, 271-282 (1978).
Callaghan, P. T. et al., "High Resolution of Space Imaging in Porous Structure", Submitted for Pub. *J. of Mag. Reson.* 1990.
Timur, A., "Pulsed Nuclear Magnetic Resonance Studies of Porosity, Movable Fluid and Permeability of Sandstones", *J. of Petrol Tech.*, Jun. 1969.
Herrick, et al., "An Improved NM Logging System and Application to Formation Evaluation", SPC 8361 Presented Las Vegas 1979.
Cooper, R. K. et al., "Remote NRM.I Production of a Region of Homogeneous Magnetic Field", *J. Magn. Reson.* 41,400 (1980).
Burnett, L. J. et al., "Remote NRM.II Sensitivity of NMR Detection of External Samples", *J. Magn. Reson.* 41,406 (1980).
Jackson, et al., "Remote NRM III Detection of Nuclear Mag. Reson. in a Remote Produced Region of Homo. Mag. Field", *J. Mag. Reson.* 1980.
Slichter, "Principles of Mag. Resonance, Appendex G", Springer-Verlag Berlin Heidelberg, N.Y., 1980.

*Primary Examiner*—Michael J. Tokar
*Attorney, Agent, or Firm*—Pennie & Edmonds

[57] ABSTRACT

A method for conducting borehole NMR measurements comprising the steps of:
  providing a magnetic field and a magnetic field gradient at a desired location along a borehole;
  carrying out at least one NMR experiment in the presence of the magnetic field gradient;
  sensing the diffusion effect on the decay of at least the first echo; and
  determining therefrom the diffusion coefficient.

Apparatus for carrying out the method is also described.

29 Claims, 3 Drawing Sheets

APPARATUS AND TECHNIQUE FOR NMR DIFFUSION MEASUREMENT

FIELD OF THE INVENTION

The present invention relates to borehole measurements and more particularly to borehole measurements employing nuclear magnetic resonance.

BACKGROUND OF THE INVENTION

There are known in the patent literature various techniques for carrying out borehole measurements employing NMR. Particularly useful techniques and apparatus for carrying out such techniques are described in U.S. Pat. Nos. 4,710,713 and 4,717,878 of the present assignee. U.S. Pat. No. 4,933,638 describes a technique which is based thereon.

It is known to carry out laboratory tests of the self-diffusion coefficient, i.e. the rate at which molecules of a material randomly travel within the bulk of the same material, on cores. Providing the cores for testing is a very expensive and time consuming process and is not suitable for sampling a large extent of a borehole.

A representative listing of relevant publications in this field is set forth hereinbelow:

J.H. Simpson and H.Y. Carr, Diffusion and Nuclear Spin Relaxation in Water, The Physical Review, 111, No. 5, Sep. 1, 1958, p 1201 ff.

D.C. Douglass and D.W. McCall, Diffusion in Paraffin Hydrocarbons, Journal of Physical Chemistry, 62, 1102 (1958);

D.E. Woessner, N.M.R. Spin Echo Self Diffusion Measurements on Fluids Undergoing Restricted Diffusion, Journal of Physical Chemistry, 87, 1306 (1963);

R.C. Wayne and R.M. Cotts, Nuclear Magnetic Resonance Study of Self-Diffusion in a Bounded Medium, Physical Review, 151, No. 1, Nov. 4, 1964;

E.O. Stejskql and J.E. Tanner, Spin Diffusion Measurements: Spin Echoes in the Presence of a Time Dependent Field Gradient, The Journal of Chemical Physics, Vol. 42, No. 1, 288-292, Jan. 1, 1965.

K.J. Packer and C. Rees, Pulsed NMR Studies of Restricted Diffusion, Journal of Colloid and Interface Science, Vol. 40, No. Aug. 2, 1972;

C.H. Neuman, Spin echo of spins diffusing in a bounded medium, The Journal of Chemical Physics, Vol. 60, No. 11, Jun. 1, 1974;

W.D. Williams, E.F.W. Seymour and R. M. Cotts, A Pulsed Gradient Multiple-Spin Echo NMR Technique for Measuring Diffusion in the Presence of Background Magnetic Field Gradients, Journal of Magnetic Resonance 31, 271-282, (1978);

U.S. Pat. No. 4,719,423 describes NMR imaging of materials for transport properties including diffusion coefficients. This patent relates to imaging of core samples and not in situ;

P.T. Callaghan, D. Macgowan, K.J. Packer and F.O. Zelaya, High Resolution q-space Imaging in Porous Structure, submitted for publication in the Journal of Magnetic Resonance, 1990;

U.S. Pat. No. 4,350,955 of J.A. Jackson et al. and other publications of J.A. Jackson on the same general subject.

SUMMARY OF THE INVENTION

The present invention seeks to provide a technique and apparatus for conducting borehole NMR measurements of self-diffusion coefficient and the intrinsic transverse relaxation time.

There is thus provided in accordance with a preferred embodiment of the present invention a technique for conducting borehole NMR measurements including the steps of providing a magnetic field gradient at a desired location along a borehole, carrying out at least one and preferably two or more NMR experiments in the presence of the magnetic field gradient, sensing the diffusion effect on the decay of at least the first echo and determining therefrom the diffusion coefficient.

In accordance with one embodiment of the invention, the magnetic field gradient is constant over time. Alternatively a switched magnetic field gradient may be provided.

In accordance with one embodiment of the invention the step of carrying out at least one NMR experiment includes carrying out two NMR experiments such that they differ in at least one of the following parameters: 1. the time the molecules area allowed to diffuse, 2. the magnitude of the magnetic field gradient and 3. the time over which the pulses are applied if magnetic field gradient pulses are used.

More particularly, the two experiments may differ only in the echo spacing. In such case, the $T_2$ (transverse relaxation time) and D (diffusion coefficient) can be extracted from the measured amplitudes and decay rates.

Alternatively, when the gradients are constant and are themselves a function of the magnetic field strength, the two experiments may differ in the applied RF frequency. The difference in frequency is accompanied by a change in the magnetic field gradient strength.

In an extension of the above-described technique, more than two such experiments can be conducted. Results of repeated experiments can then be integrated and averaged to enhance the signal-to-noise ratio and the two or more different experiments may be used for calculating the Diffusion Coefficient and the transverse relaxation time $T_2$.

In another extension, several such experiments might all be combined into a single experiment by acquiring all the required data from the signals of a single excitation. This can be accomplished by changing the abovementioned parameters during a single sequence. As an illustrative example: the first few echoes are spaced by one fixed time interval, the next few by another, and so on.

A single experiment with fixed parameters such as echo spacing, magnetic field gradient magnitude and duration may be carried out to give an upper bound to the diffusion coefficient value, a lower bound to $T_2$ or either $T_2$ or D when one of them is known a priori.

In accordance with a preferred embodiment of the present invention, the diffusion coefficient D can be employed to determine at least one of the following petrophysical parameters:

Water/hydrocarbon discrimination;
Water and hydrocarbon saturation levels;
Permeability;
Pore size and pore size distribution;
Oil viscosity;
Formation form factor F, which is a measure of the average increase in electrical resistance due to the formation tortuosity; and
q-space imaging of the formation.

There is also provided in accordance with an embodiment of the present invention apparatus for conducting borehole NMR measurements comprising:

apparatus for providing a magnetic field gradient at a desired location along a borehole;

apparatus for carrying out at least one NMR experiment in the presence of the magnetic field gradient;

apparatus for sensing the diffusion effect on the decay of at least the first echo; and apparatus for determining therefrom the diffusion coefficient.

There is also provided in accordance with an embodiment of the invention apparatus for conducting borehole NMR measurements comprising:

apparatus for applying a static magnetic field to polarize the nuclear spins in the material at a given region of the borehole, thus creating bulk magnetization at the region of interest;

apparatus for applying an RF field to the region of interest at a preselected frequency, duration and magnitude in order to cause at least part of the magnetization to lie in a horizontal plane, defined relative to the plane of the borehole;

apparatus for applying a fixed magnetic field gradient to the region of interest, thereby causing the atoms and molecules of the material in the region of interest to diffuse;

apparatus for applying a refocusing RF pulse to the region of interest;

apparatus for again applying a fixed magnetic field gradient to the region of interest, thereby causing the atoms and molecules of the material in the region of interest to diffuse;

apparatus for acquiring the NMR spin echo; and apparatus for deriving the diffusion coefficient D or the spin echo decay $T_2$ from the echo amplitudes.

There is also provided in accordance with an embodiment of the invention apparatus for conducting borehole NMR measurements comprising:

apparatus for applying a static magnetic field to polarize the nuclear spins in the material at a given region of the borehole, thus creating bulk magnetization at the region of interest;

apparatus for applying an RF field to the region of interest at a preselected frequency, duration and magnitude in order to cause at least part of the magnetization to lie in a horizontal plane, defined relative to the plane of the borehole;

apparatus for applying a time switched magnetic field gradient to the region of interest, thereby causing the atoms and molecules of the material in the region of interest to diffuse;

apparatus for applying a refocusing RF pulse to the region of interest;

apparatus for again applying a fixed magnetic field gradient to the region of interest, thereby causing the atoms and molecules of the material in the region of interest to diffuse;

apparatus for acquiring the NMR spin echo; and apparatus for deriving the diffusion coefficient D or the spin echo decay $T_2$ from the echo amplitudes.

The methods described hereinabove are suitable for use in environments other than borehole environments and with materials other than those found in boreholes. The methods have the advantage that the material being tested may be located outside the testing apparatus.

BRIEF DESCRIPTION OF THE DRAWINGS

The present invention will be understood and appreciated more fully from the following detailed description, taken in conjunction with the drawings in which.

DETAILED DESCRIPTION OF A PREFERRED EMBODIMENT

Figure 1A:
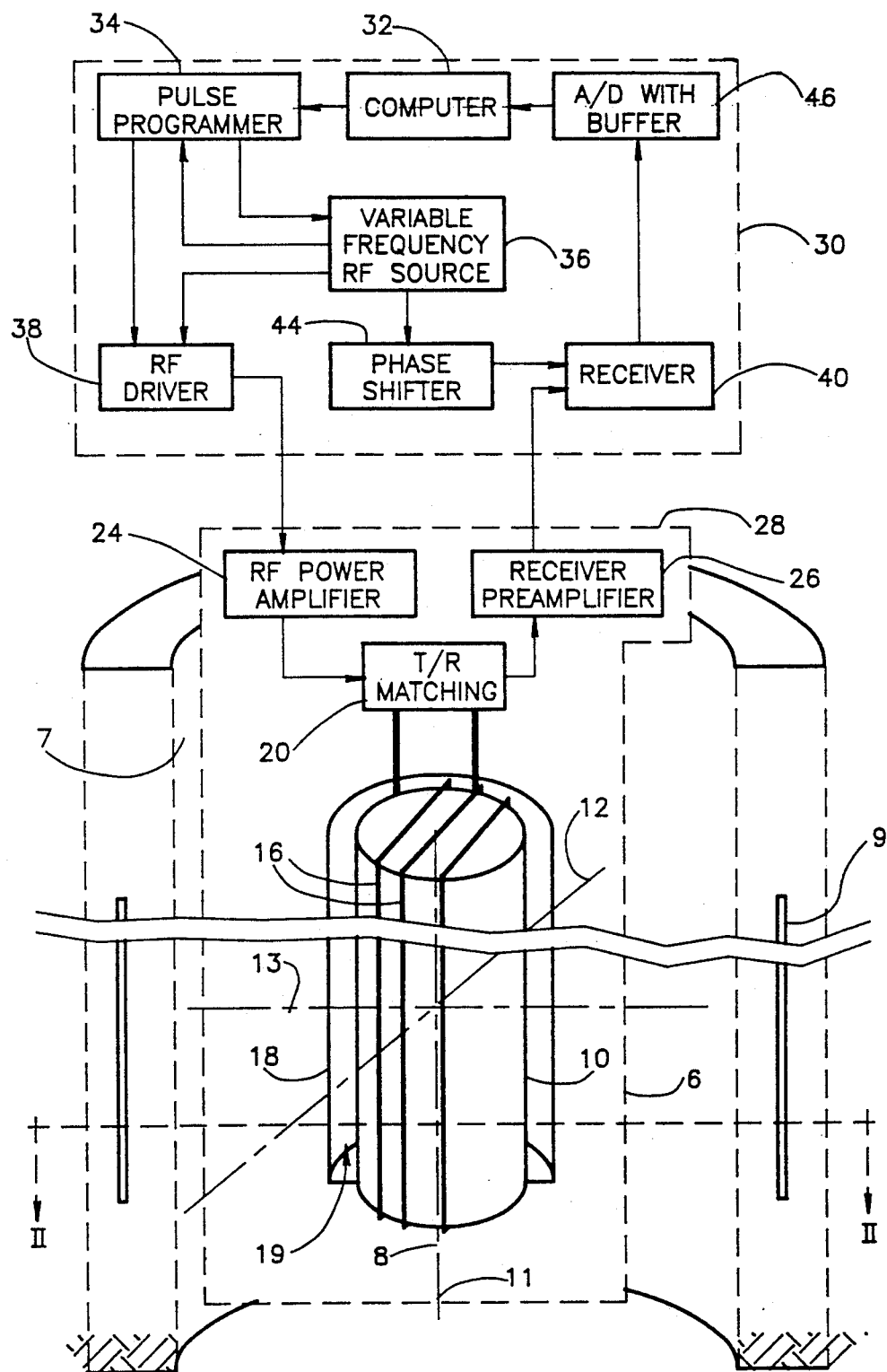
FIG. 1A is a block diagram illustration of apparatus for carrying out borehole diffusion coefficient determinations in accordance with a preferred embodiment of the present invention, wherein the magnetic field gradient is constant over time.

Reference is now made to FIG. 1A, which illustrates, in relatively general form, apparatus for carrying out NMR borehole diffusion coefficient determinations in accordance with a preferred embodiment of the present invention. The apparatus includes a first portion 6, which is arranged to be lowered into a borehole 7 having a borehole longitudinal axis 8 in order to examine the nature of materials in the vicinity of the borehole lying in a region 9 of generally cylindrical configuration spaced from and surrounding the borehole.

The first portion 6 preferably comprises a generally cylindrical permanent magnet 10, preferably having a circular cross section and arranged along a permanent magnet longitudinal axis 11 which is preferably coaxial with the longitudinal axis 8 of the borehole. According to an alternative embodiment of the invention a plurality of permanent magnets 10 may be employed. Through the specification, the one or more permanent magnets 10 will be considered together and referred to as permanent magnet 10 and their common longitudinal axis will be identified as longitudinal axis 11.

The first portion 6 also comprises one or more coil windings 16 which preferably are arranged on the permanent magnet surface such that each coil turn lies in a plane substantially parallel to a plane containing permanent magnet magnetization axis 12 and longitudinal axis 11. Specifically, the axis 13 of the coil windings 16 is substantially perpendicular to both longitudinal axis 11 of the borehole and axis 12 of the permanent magnet magnetization.

The permanent magnet 10 and coil windings 16 are preferably housed in a non-conductive, non-ferromagnetic protective housing 18. The housing and its contents hereinafter will be referred to as a probe 19.

The coil windings 16, together with a transmitter/receiver (T/R) matching circuit 20 define a transmitter/receiver (T/R) circuit. T/R matching circuit 20 typically includes a resonance capacitor, a T/R switch and both to-transmitter and to-receiver matching circuitry and is coupled to a RF power amplifier 24 and to a receiver preamplifier 26.

All of the elements described hereinabove are normally contained in a housing 28 which is passed through the borehole. Alternatively some of the above elements may not be contained in the housing 28 and may be located above ground.

Indicated by block 30 is control circuitry for the logging apparatus including a computer 32, which provides a control output to a pulse programmer 34 which receives an RF input from a variable frequency RF source 36. Pulse programmer 34 controls the operation of the variable frequency RF source 36 as well as an RF driver 38, which receives an input from variable frequency RF source 36 and outputs to RF power amplifier 24.

The output of RF receiver preamplifier 26 is supplied to an RF receiver 40 which receives an input from a phase shifter 44. Phase shifter 44 receives an input from variable frequency RF source 36. Receiver 40 outputs via an A/D converter with a buffer 46 to computer 32 for providing desired well logging output data for further use and analysis.

Some or all of the elements described hereinabove as being in block 30 are preferably disposed downhole. Alternatively such elements may be disposed in an above-ground housing.

Figure 1B:
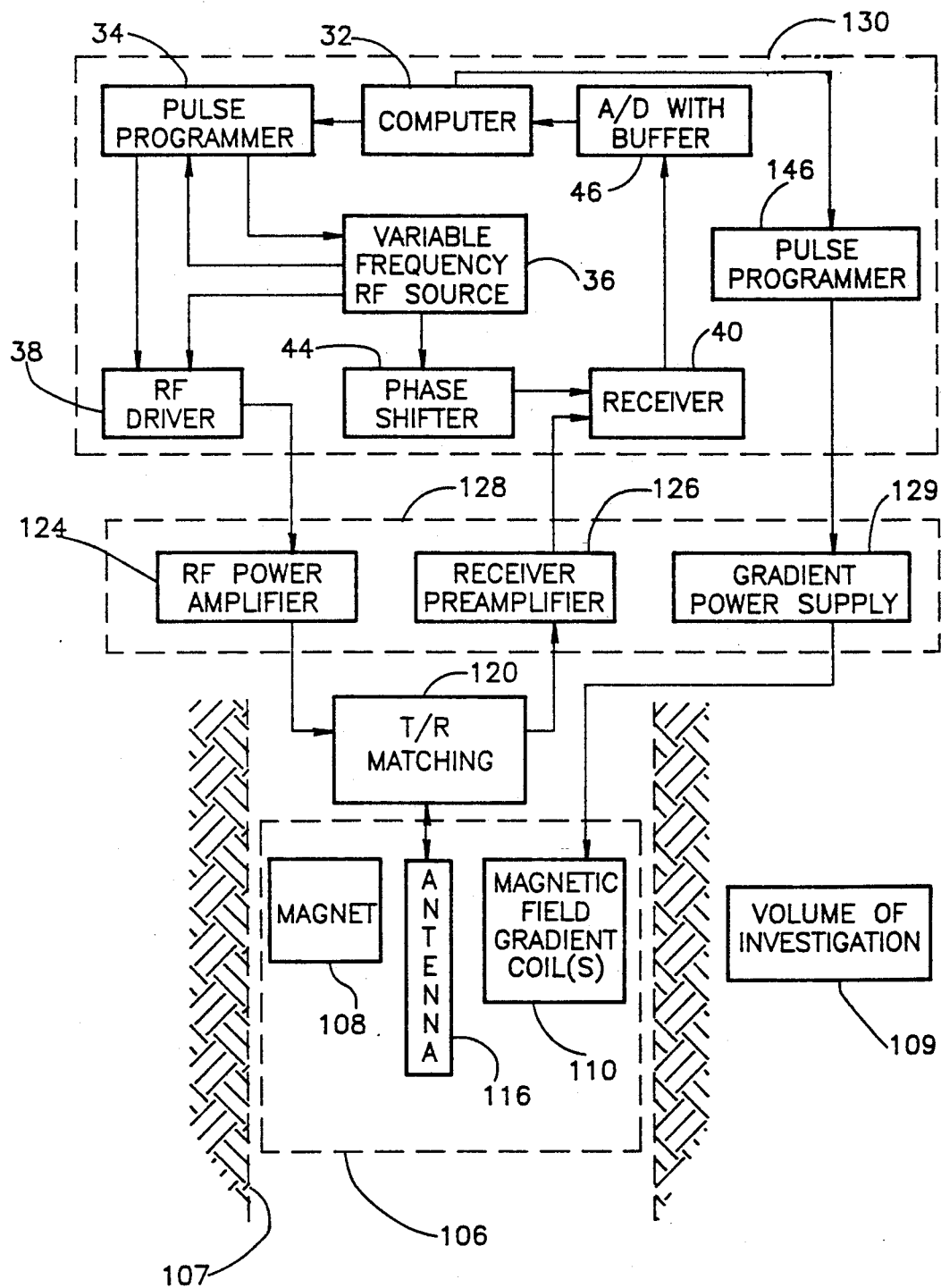
FIG. 1B is a block diagram illustration of apparatus for carrying out borehole diffusion coefficient determinations in accordance with an alternative embodiment of the present invention, wherein the magnetic field gradient is pulsed.

Reference is now made to FIG. 1B, which illustrates, in relatively general form, apparatus for carrying out NMR borehole diffusion coefficient determinations in accordance with an alternative preferred embodiment of the present invention. The apparatus includes a first portion 106, which is arranged to be lowered into a borehole 107 in order to examine the nature of materials in the vicinity of the borehole.

The first portion 106 comprises a magnet or a plurality of magnets 108 which generate a preferably substantially uniform static magnetic field in a volume of investigation 109. The first portion 106 also comprises an RF antenna coil 116 which produces an RF magnetic field at the volume of investigation 109 which field is substantially perpendicular to the static magnetic field.

A magnetic field gradient coil, or plurality of coils, 110 generates a magnetic field gradient at the volume of investigation 109. This additional contribution to the magnetic field has a field direction preferably collinear with the substantially uniform field and has a substantially uniform magnetic field gradient, which may or may not be switched on and off by switching the dc current flowing through the coil or coils 110. The magnet or magnets 108, antenna 116 and the gradient coil 110 constituting portion 106 are also referred to as a probe.

The antenna together with a transmitter/receiver (T/R) matching circuit 120 typically include a resonance capacitor, a T/R switch and both to-transmitter and to-receiver matching circuitry and are coupled to an RF power amplifier 124 and a receiver preamplifier 126.

A power supply 129 provides the dc current required for the magnetic field gradient generating coils 110.

All the elements described hereinabove are normally contained in a housing 128 which is passed through the borehole. Alternatively, some of the above elements may be located above ground.

Indicated in a block 130 is control circuitry for the logging apparatus which may be generally identical to that described above with reference to block 30 in connection with the embodiment of FIG. 1A, with the addition of a pulse programmer 146.

Pulse programmer 146 controls the gradient coil power supply 129 enabling and disabling the flow of current, and hence the generation of field gradients, according to the commands of the computer 32.

Some or all of the elements described hereinabove as being disposed in an above-ground housing, may instead be disposed below ground.

Figure 2A:
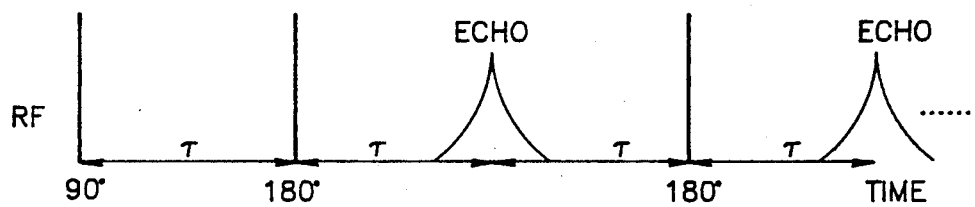
FIGS. 2A and 2C are illustrations of RF pulses and echoes and Magnetic Field Gradient Sequences respectively which are employed in accordance with one embodiment of the present invention.
Figure 2B:
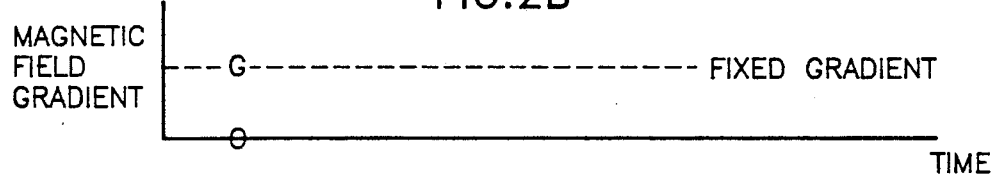

Reference is now made to FIGS. 2A and 2B which illustrate RF pulses and echoes and Magnetic Field Gradient Sequences respectively which are employed in accordance with one embodiment of the present invention. In this embodiment of the invention, the following operational steps take place:

1. A static magnetic field is applied to polarize the nuclear spins in the material at a given region of the borehole, thus creating bulk magnetization at the region of interest. The field and the collinear magnetization thus produced define a vertical direction.

2. A magnetic field gradient is applied at the region of interest. This gradient field might or might not be part of the static magnetic field of the first step.

3. An RF field is applied to the region of interest at a preselected frequency, duration and magnitude in order to cause at least part of the magnetization to lie in a horizontal plane, defined relative to the vertical axis.

4. A time interval t through which atoms and molecules of the material in the region of interest may diffuse within a fixed magnetic gradient field.

5. A refocusing RF pulse is applied to the region of interest.

6. Step 4 is repeated.

7. The NMR spin echo is acquired.

8. The diffusion coefficient D or an upper bound thereof, or the spin echo decay $T_2$ or a lower bound thereof is derived from the echo amplitude.

9. Steps 1 through 7 are repeated at least once, with different t or magnetic field gradient strength.

10. D and/or $T_2$ are derived from echo amplitudes of some or all of the experiments.

It is appreciated that steps 4 through 7 may be repeated multiple times successively in order to obtain a sufficiently long echo amplitude train, from which the transverse relaxation time may more meaningfully be derived.

It is further appreciated that step 8 is not required if both D and $T_2$ are unknown and neither could be considered as dominating the decay rate. Steps 9 and 10 are not required if either D or $T_2$ is known. In that case, the unknown $T_2$ or D can be derived from a single experiment. Likewise, no more than one experiment is required when either D or $T_2$ is known to substantially dominate the decay of the echo amplitude.

The advantage of repeating the experiment and integrating the measurement readings in order to obtain statistically valid and meaningful results is also appreciated.

It is also recognized that step 5 might alternatively be replaced by application of two or more pulses whose combined effect is the refocusing of the nuclear spins yielding a stimulated echo at step 7 and allowing more time for diffusion in between these pulses.

Figure 3A:
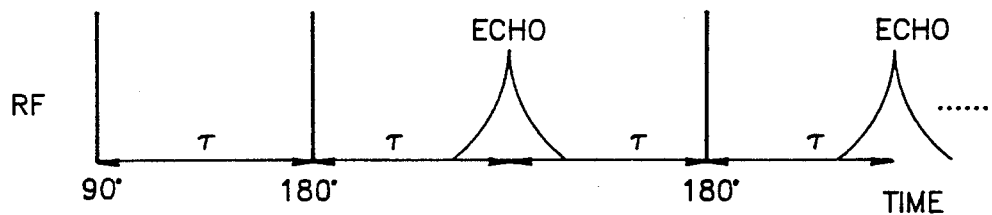
FIGS. 3A and 3B are illustrations of RF pulses and echoes and Magnetic Field Gradient Sequences respectively which are employed in accordance with one embodiment of the present invention.
Figure 3B:
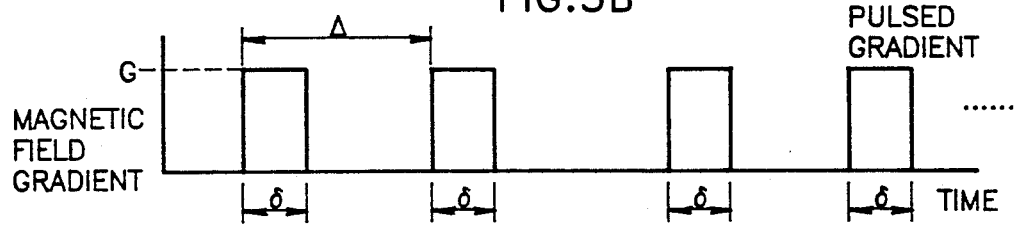

Reference is now made to FIGS. 3A and 3B which illustrate RF pulses and echoes and Magnetic Field Gradient Sequences respectively, which are employed in accordance with another embodiment of the present invention. In this embodiment of the invention, the following operational steps take place:

1. Step 1 described above.
2. Step 3 described above.
3. A time switched magnetic field gradient pulse is applied through which the atoms and molecules of the material in the region of interest may diffuse.

Typical pulse amplitude, duration and frequency are 0.1-30 G/cm for 0.1-10 ms.
4. Step 5 described above.
5. Repeat step 3.
6. Step 7 described above.
7. Derive the diffusion coefficient D, or an upper bound thereof, or the spin echo decay T2 or a lower bound thereof, from the echo amplitudes.
8. Repeat steps 1 through 6 with a different value for at least one of the following variables: magnetic field gradient strength of steps 3 and 5; magnetic field gradient duration of steps 3 and 5; timing of steps 3,4,5 and 7.
9. Derive the diffusion coefficient and/or T2 from the acquired NMR data.

It is appreciated that steps 3 through 6 may be repeated multiple times successively in order to obtain a sufficiently long echo amplitude train, from which the transverse relaxation time may more meaningfully be derived.

It is further appreciated that step 7 is not required if both D and T2 are unknown and neither could be considered as dominating the decay rate. Steps 8 and 9 are not required if either D or T2 is known. In that case, the unknown T2 or D can be derived from a single experiment. Likewise, no more than one experiment is required when either D or T2 is known to substantially dominate the decay of the echo amplitude.

It is further appreciated that time dependency of the magnetic field gradient other than the square pulse of FIG. 3B may be used. Specifically, when the pulsed gradient is switched off, the gradient strength should not necessarily diminish and sinusoidal and other dependencies might be employed.

The advantage of repeating the experiment and integrating the measurement readings in order to obtain statistically valid and meaningful results is also appreciated.

It is also recognized that step 4 might alternatively be replaced by application of two or more pulses whose combined effect is the refocusing of the nuclear spins yielding a stimulated echo at step 6 and allowing more time for diffusion in between these pulses.

The derivation of the diffusion coefficient D may be carried out using the following equations for the constant gradient case:

$$a_n = A3^{-nte(1/T + D(\Gamma Gte)2/12)}$$

or for the pulsed gradient:

$$a_n = Ae^{-n(te/T2 + D(\delta G\Gamma)2(delta - \Gamma/2))}$$

where,
A is the magnitude of the signal at te→0 or zero time. A might or might not be known.
n is the echo number.
$a_n$ is its measured amplitude.
te is the interecho spacing applied by the experimenter.
T2 is the intrinsic transverse relaxation time of the liquid at the in situ physical and chemical conditions.
T2 might or might not be known prior to the measurement.
D is the diffusion coefficient of the fluid at the in situ conditions. D might or might not be known prior to the measurement.

Γ is the gyromagnetic ratio of the isotope studied ($2\pi \times 4.26$ KHz/Gauss for hydrogen).
G is the magnitude of the magnetic field gradient imposed at the volume of investigation by the experimental setup. G is known.
δ is the duration of the magnetic field gradient pulse, and
delta is the time between the two magnetic field gradient pulses which precede each echo.

Four cases are treated;

1. Two out of the three parameters of the liquid in the volume of investigation—A, T2 and D—are known. The third might then be derived from the above equations. For example, if A and T2 are known and the first echo amplitude, $a_1$ is measured, then for a constant gradient $$D = [-te/T2 - \ln(a_1/A)] * 12/(\Gamma G)^2 te^3$$

More echoes, as well as repeated measurements, may improve the statistical validity of this result.

2. The amplitude A is known, neither T2 nor D are known but only an upper bound for D and/or lower bound for T2 is sought for. An upper bound for D is obtained from the abovementioned equations by replacing the te/T2 term by zero. A lower bound for T2 is obtained by setting D=0. Such bounds may be very useful in various cases, e.g. in discriminating hydrocarbon from water on the basis of either D or T2, or in discriminating light from heavy oil.

3. A is either known or unknown but of no interest. Several echoes are recorded and the apparent decay rate is calculated. As an example, for the constant gradient case, the apparent transverse relaxation time is:

$$T2^{(app)} = [1/T2 + D(\Gamma Gte)^2/12]^{-1}$$

It is derived from a best fit procedure of the measure of echo amplitudes, $a_n$, to their representation $$a_n = Ae^{-nC}$$

where $C = te/T2^{(app)}$
in which $T2^{(app)}$ is a fitting parameter.

Alternatively, by dividing all of the amplitudes by one of the echo amplitudes, for example, $a_1$, the obtained ratios are to be represented by the right hand of $$a_n/a_1 = \exp] - (nte - te)/T2^{(app)}]$$

A is factored out and D, T2 or either of their bounds can be derived from the abovementioned equation relating $T2^{(app)}$ T2 and D. Once again, the upper D bound is obtained by setting 1/T2 to zero and solving for D, and the lower T2 bound is obtained by setting D to zero.

Alternatively, T2 or D or either of their bounds can be derived from repetition of the same experiment at least twice, varying one or more of the following parameters: te, G, delta or δ.

4. If both D and T2 are unknown and the abovementioned bounds are insufficient approximations, the apparent relaxation time should be calculated at least twice for two experiments differing in at least one of the following parameters: te, G, delta or δ. In cases such as that of a preferred embodiment of this invention, for which the gradient G is also a function of the field strength and hence a function of the resonance frequency, two or more experiments differing in the resonance frequency are sufficient.

It is convenient, though not necessary, to rewrite the relation between $T_2^{(app)}$, $T_2$ and $D$ in terms of $$R_2^{(app)} = 1/T_2^{(app)}$$

and $$R_2 = 1/T_2.$$

The equation for $R_2$ and $D$ is a linear equation, e.g.:

$$R_2^{(app)} = R_2 + D(\Gamma G t_e^2)/12$$

for the fixed gradient embodiment. The two or more distinct experiments yield a set of two or more linear equations for $T_2$ and $D$ having different values of $R_2^{(app)}$. Out of this set of two or more equations, $T_2$ and $D$ may be derived by either explicit solution of the two linear equations yielding the values of the two unknowns, or best fit (such as least squares) for a set of three or more distinct experiments.

It is appreciated that several experiments of the type described above may be combined into a single experiment by acquiring all the required data from the signals of a single excitation. This can be accomplished by changing the abovementioned parameters during a single sequence. As an illustrative example: the first few echoes are spaced by one fixed time interval, the next few by another, and so on.

It will be appreciated by persons skilled in the art that the present invention is not limited by what has been particularly shown and described hereinabove. Rather the scope of the present invention is defined only by the claims which follow:

I claim:
1. A method for conducting borehole NMR measurements comprising the steps of:
   providing a magnetic field and a magnetic field gradient of a predetermined magnitude at a desired location along a borehole, said magnetic field gradient being applied for a predetermined duration of time thereby allowing molecules in said location to diffuse;
   carrying out at least one NMR measurement in the presence of the magnetic field gradient by applying an RF field of a preselected frequency, said NMR measurement containing at least one echo;
   sensing a diffusion effect on the decay of at least the first of said at least one echo; and
   determining therefrom a diffusion coefficient.
2. A method according to claim 1 and wherein said step of carrying out includes the steps of carrying out at least two NMR measurements and wherein each measurement has a predetermined spacing between said at least one echo.
3. A method according to claim 1 and wherein said magnetic field gradient is constant over time.
4. A method according to claim 2 and wherein said magnetic field gradient is constant over time.
5. A method according to claim 1 and wherein said magnetic field gradient is a switched magnetic field gradient.
6. A method according to claim 2 and wherein said magnetic field gradient is a switched magnetic field gradient.
7. A method according to claim 2 and wherein said at least two NMR measurements differ in at least one of the following parameters: 1. the time the molecules are allowed to diffuse, 2. the magnitude of the magnetic field gradient, 3. the duration the magnetic field gradient is applied, 4. echo spacing and 5. the frequency of the applied RF field.
8. A method according to claim 1 and wherein at least one of the following parameters is changed during a given NMR measurement: 1. the time the molecules are allowed to diffuse, 2. the magnitude of the magnetic field gradient, 3. the duration the magnetic field gradient is applied, 4. echo spacing.
9. A method according to claim 1 and also comprising the step of employing the diffusion coefficient D to determine at least one of the following petrophysical parameters:
   Water/hydrocarbon discrimination;
   Water and hydrocarbon saturation levels;
   Permeability;
   Pore size and pore size distribution;
   Oil viscosity;
   Formation form factor F; and
   q-space imaging of the formation.
10. A method according to claim 2 and also comprising the step of employing the diffusion coefficient D to determine at least one of the following petrophysical parameters:
    Water/hydrocarbon discrimination;
    Water and hydrocarbon saturation levels;
    Permeability;
    Pore size and pore size distribution;
    Oil viscosity;
    Formation form factor F; and
    q-space imaging of the formation.
11. A method for conducting borehole NMR measurements comprising the steps of:
    1. applying a static magnetic field to polarize nuclear spins in material at a given region of a borehole, thus creating bulk magnetization at the region;
    2. applying an RF field to the region at a preselected frequency, duration and magnitude in order to cause at least part of the magnetization to lie in a plane horizontal to the plane of the borehole;
    3. applying a fixed magnetic field gradient to the region, thereby allowing atoms and molecules of the material in the region of interest to diffuse in the gradient field;
    4. applying a refocusing RF pulse to the region;
    5. repeating step 3;
    6. acquiring an NMR spin echo having an associated echo amplitude; and
    7. deriving a diffusion coefficient D and/or a spin echo decay T2 from the echo amplitude.
12. A method according to claim 11 and also comprising repeating the steps 3–6 in order to acquire a plurality of echoes and to derive T2 and/or D therefrom.
13. A technique for conducting borehole NMR measurements comprising the steps of:
    1. applying a static magnetic field to polarize nuclear spins in material at a given region of a borehole, thus creating bulk magnetization at the region;
    2. applying an RF field to the region at a preselected frequency, duration and magnitude in order to cause at least part of the magnetization to lie in a plane horizontal to the plane of the borehole;
    3. applying a time switched magnetic field gradient to the region, thereby allowing atoms and molecules of the material in the region to diffuse in the gradient field;
    4. applying a refocusing RF pulse to the region;

5. repeating step 3;
6. acquiring an NMR spin echo having an associated echo amplitude; and
7. deriving a diffusion coefficient D and/or a spin echo decay T2 from the echo amplitude.

14. A method according to claim 13 and also comprising repeating the steps 3-6 in order to acquire a plurality of echoes and to derive T2 and/or D therefrom.

15. Apparatus for conducting borehole NMR measurements comprising:
means for providing a magnetic field gradient of a predetermined magnitude at a desired location along a borehole, said magnetic field gradient being applied for a predetermined duration of time thereby allowing molecules in said location to diffuse;
means for carrying out at least one NMR measurement in the presence of the magnetic field gradient by applying an RF field of a preselected frequency, said NMR measurement containing at least one echo;
means for sensing a diffusion effect on the decay of at least the first of said at least one echo; and
means for determining therefrom a diffusion coefficient.

16. Apparatus according to claim 15 and wherein said means for carrying out includes means for carrying out at least two NMR measurements and wherein each measurement has a predetermined spacing between said at least one echo.

17. Apparatus according to claim 16 and wherein said means for carrying out at least two NMR measurements include means for varying at least one of the following parameters during a measurement: 1. the time the molecules are allowed to diffuse, 2. the magnitude of the magnetic filed gradient, 3. the duration the magnetic field gradient is applied, 4. echo spacing; and, 5. the frequency of the applied RF field.

18. Apparatus according to claim 15 and wherein said magnetic field gradient is constant over time.

19. Apparatus according to claim 15 and wherein said magnetic field gradient is a switched magnetic field gradient.

20. Apparatus according to claim 16 and wherein said two NMR measurements differ in at least one of the following parameters: 1. the time the molecules are allowed to diffuse, 2. the magnitude of the magnetic field gradient, 3. the duration the magnetic field gradient, is applied, 4. the echo spacing and 5. the frequency of the applied RF field.

21. Apparatus according to claim 15 and also comprising means for employing the diffusion coefficient D to determine at least one of the following peterophysical parameters:
Water/hydrocarbon discrimination;
Water and hydrocarbon saturation levels;
Permeability;
Pore size and pore size distribution;
Oil viscosity;
Formation form factor F; and
q-space imaging of the formation.

22. Apparatus for conducting borehole NMR measurements comprising:
means for applying a static magnetic field to polarize nuclear spins in material at a given region of a borehole, thus creating bulk magnetization at the region;
means for applying an RF field to the region at a preselected frequency, duration and magnitude in order to cause at least part of the magnetization to lie in a plane horizontal to the plane of the borehole;
means for applying a fixed magnetic field gradient to the region, thereby causing atoms and molecules of the material in the region to diffuse;
means for applying a refocusing RF pulse to the region;
means for reapplying the fixed magnetic field gradient to the region, thereby causing atoms and molecules of the material in the region to diffuse;
means for acquiring an NMR spin echo and associated echo amplitude; and
means for deriving a diffusion coefficient D or a spin echo decay T2 from the echo amplitude.

23. Apparatus for conducting borehole NMR measurements comprising:
means for applying a static magnetic field to polarize nuclear spins in material at a given region of a borehole, thus creating bulk magnetization at the region;
means for applying an RF field to the region at a preselected frequency, duration and magnitude in order to cause at least part of the magnetization to lie in a plane horizontal to the plane of the borehole;
means for applying a time switched magnetic field gradient to the region, thereby causing the atoms and molecules of the material in the region to diffuse;
means for applying a refocusing RF pulse to the region;
means for reapplying the switched magnetic field gradient to the region, thereby causing atoms and molecules of the material in the region to diffuse;
means for acquiring an NMR spin echo and associated echo amplitude; and
means for deriving a diffusion coefficient D or a spin echo decay T2 from the echo amplitude.

24. A method for conducting NMR measurements of a material comprising the steps of:
providing a magnetic field gradient at a desired location in the material from a magnet spaced externally with respect to the material;
carrying out at least one NMR measurement in the presence of the magnetic field gradient, which measurement produces at least a first echo;
sensing a diffusion effect on the decay of at least the first echo; and
determining therefrom a diffusion coefficient.

25. A method for conducting NMR measurements comprising the steps of:
1. applying a static magnetic field to polarize nuclear spins in a material at a given region exterior to the source of the static magnetic field, thus creating bulk magnetization at the region;
2. applying an RF field to the region at a preselected frequency, duration and magnitude in order to cause at least part of the magnetization to lie in a plane perpendicular to the direction of the static magnetic field;
3. applying a fixed magnetic field gradient to the region, thereby allowing the atoms and molecules of the material in the region to diffuse in a gradient field;
4. applying a refocusing RF pulse to the region;

5. repeating step 3;
6. acquiring an NMR spin echo and associated echo amplitude; and
7. deriving a diffusion coefficient D and/or a spin echo decay T2 from the echo amplitude.

26. A method according to claim 25 and also comprising repeating the steps 3-6 to acquire multiple echoes and deriving the diffusion coefficient D and/or the spin echo decay T2 from the echo amplitudes.

27. A method for conducting NMR measurements comprising the steps of:
1. applying a static magnetic field to polarize nuclear spins in a material at a given region exterior to the source of the static magnetic field, thus creating bulk magnetization at the region of interest;
2. applying an RF field to the region at a preselected frequency, duration and magnitude in order to cause at least part of the magnetization to lie in a plane perpendicular to the direction of the static magnetic field;
3. applying a time switched magnetic field gradient to the region, thereby allowing the atoms and molecules of the material in the region to diffuse in a gradient field;
4. applying a refocusing RF pulse to the region of interest;
5. repeating step 3;
6. acquiring an NMR spin echo and associated echo amplitude; and
7. deriving a diffusion coefficient D and/or a spin echo decay T2 from the echo amplitude.

28. A method according to claim 27 and also comprising repeating the steps 3-6 to acquire multiple echoes and deriving the diffusion coefficient D and/or the spin echo decay T2 from the echo amplitudes.

29. Apparatus for conducting NMR measurements comprising:
means for providing a magnetic field gradient at a desired location in a material located externally of the source of the magnetic field gradient;
means for carrying out at least one NMR measurement in the presence of the magnetic field gradient, producing at least a first echo;
means for sensing a diffusion effect on the decay of at least the first echo; and
means for determining therefrom a diffusion coefficient.

* * * * *